(12) United States Patent
Ballantine et al.

(10) Patent No.: US 7,456,074 B2
(45) Date of Patent: Nov. 25, 2008

(54) INCREASING AN ELECTRICAL RESISTANCE OF A RESISTOR BY NITRIDIZATION

(75) Inventors: Arne W. Ballantine, Round Lake, NY (US); Daniel C. Edelstein, White Plains, NY (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/836,308

(22) Filed: Aug. 9, 2007

(65) Prior Publication Data

US 2007/0267286 A1    Nov. 22, 2007

Related U.S. Application Data

(62) Division of application No. 10/753,241, filed on Jan. 8, 2004, now Pat. No. 7,351,639, which is a division of application No. 09/712,391, filed on Nov. 14, 2000, now Pat. No. 6,730,984.

(51) Int. Cl.
    *H01L 21/20*    (2006.01)
(52) U.S. Cl. .................... 438/381; 438/238; 438/382; 257/E27.047
(58) Field of Classification Search .......... 438/238, 438/381–382, 775; 257/E27.047
    See application file for complete search history.

(56) References Cited

U.S. PATENT DOCUMENTS

| | | |
|---|---|---|
| 3,148,129 A | 9/1964 | Basseches et al. |
| 4,292,384 A | 9/1981 | Staughan et al. |
| 4,485,370 A | 11/1984 | Poisel |
| 4,533,935 A | 8/1985 | Mochizuki |
| 5,005,101 A | 4/1991 | Gallagher et al. |
| 5,232,865 A | 8/1993 | Manning et al. |
| 5,470,780 A | 11/1995 | Shishiguchi |
| 5,661,503 A | 8/1997 | Terai |
| 5,917,286 A | 6/1999 | Scholl et al. |
| 6,015,728 A | 1/2000 | Chou |
| 6,031,250 A | 2/2000 | Brandes et al. |
| 6,043,516 A | 3/2000 | Shulze |
| 6,127,217 A | 10/2000 | Madurawe et al. |
| 6,645,803 B1 * | 11/2003 | Kalnitsky et al. ........... 438/238 |

FOREIGN PATENT DOCUMENTS

| | | |
|---|---|---|
| JP | 09-219382 | 8/1997 |
| KR | 10-207472 | 7/1999 |

* cited by examiner

*Primary Examiner*—H. Jey Tsai
(74) *Attorney, Agent, or Firm*—Schmeiser, Olsen & Watts; Anthony J. Canale

(57) ABSTRACT

A method for increasing an electrical resistance of a resistor, by nitridizing a fraction of a surface layer of the resistor with nitrogen particles. An embodiment comprises heating the fraction of the surface layer by a beam of radiation or particles, such that the resistor is within a chamber that includes the nitrogen-comprising molecules. An embodiment comprises using an anodization circuit to electrolytically generate nitrogen ions in an electrolytic solution in which the resistor is immersed, wherein the nitrogen particles include the electrolytically-generated nitrogen ions. An embodiment comprises immersing the resistor in a chemical solution which includes the nitrogen particles, wherein the nitrogen particles may include nitrogen-comprising liquid molecules, nitrogen ions, or a nitrogen-comprising gas dissolved in the chemical solution under pressurization. An embodiment comprises testing the resistor during a nitridizing step to determine whether the electrical resistance of the resistor is within a tolerance.

20 Claims, 7 Drawing Sheets

INCREASING AN ELECTRICAL RESISTANCE OF A RESISTOR BY NITRIDIZATION

This application is a divisional of Ser. No. 10/753,241, filed Jan. 8, 2004; which is a divisional of Ser. No. 09/712,391, U.S. Pat. No. 6,730,984.

BACKGROUND OF THE INVENTION

1. Technical Field

The present invention provides a method and structure for increasing an electrical resistance of a resistor that is located within a semiconductor structure such as a semiconductor wafer, a semiconductor chip, and an integrated circuit.

2. Related Art

A resistor on a wafer may have its electrical resistance trimmed by using laser ablation to remove a portion of the resistor. For example, the laser ablation may cut slots in the resistor. With existing technology, however, trimming a resistor by using laser ablation requires the resistor to have dimensions on the order of tens of microns. A method and structure is needed to increase the electrical resistance of a resistor on a wafer generally, and to increase the electrical resistance of a resistor having dimensions at a micron or sub-micron level.

SUMMARY OF THE INVENTION

The present invention provides a method for increasing an electrical resistance of a resistor, comprising the steps of:

providing a semiconductor structure that includes the resistor; and oxidizing a fraction F of a surface layer of the resistor with oxygen particles, resulting in the increasing of the electrical resistance of the resistor.

The present invention provides an electrical structure, comprising:

a semiconductor structure that includes a resistor; and oxygen particles in an oxidizing reaction with a fraction F of a surface layer of the resistor, wherein the oxidizing reaction increases an electrical resistance of the resistor.

The present invention provides a method for increasing an electrical resistance of a resistor, comprising the steps of:

providing a semiconductor structure that includes the resistor; and nitridizing a fraction F of a surface layer of the resistor with nitrogen particles, resulting in the increasing of the electrical resistance of the resistor.

The present invention provides an electrical structure, comprising:

a semiconductor structure that includes a resistor; and nitrogen particles in an nitridizing reaction with a fraction F of a surface layer of the resistor, wherein the nitridizing reaction increases an electrical resistance of the resistor.

The present invention provides a method and structure for increasing an electrical resistance of a resistor on a wafer generally, and for increasing the electrical resistance of a resistor having dimensions at a micron or sub-micron level.

DETAILED DESCRIPTION OF THE INVENTION

Figure 1:
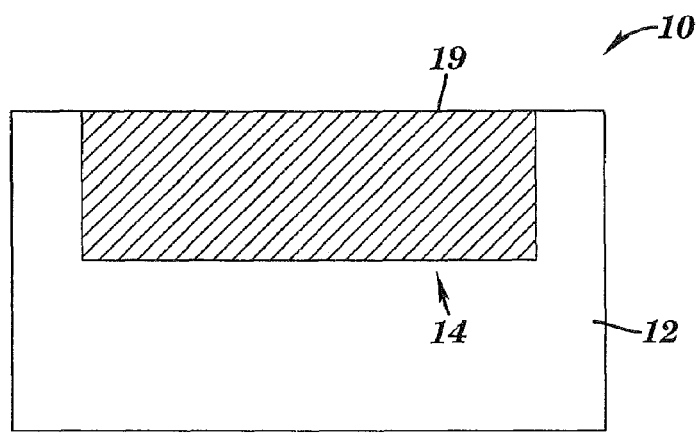
FIG. 1 depicts a front cross-sectional view of a semiconductor structure that includes an electrical resistor, in accordance with embodiments of the present invention.

FIG. 1 illustrates a front cross-sectional view of a semiconductor structure 10 that includes an electrical resistor 14 within a semiconductor substrate 12, in accordance with embodiments of the present invention. The electrical resistor 14 includes an electrically resistive material. The semiconductor structure 10 may include, inter alia, a semiconductor wafer, a semiconductor chip, an integrated circuit, etc. The substrate 12 comprises all portions of the semiconductor structure 10 (e.g., electronic devices including semiconductor devices, wiring levels, etc.) exclusive of the resistor 14. The resistor 14 may have any electrical resistance functionality within the semiconductor substrate 12 and accordingly may exist within a semiconductor device, within an electrical circuit, etc. The resistor 14 includes an exposed surface 19 having a surface area S.

Figure 2:
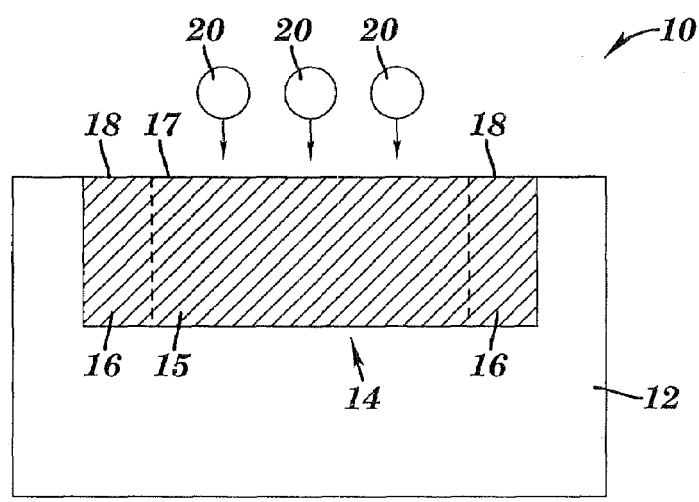
FIG. 2 depicts FIG. 1 at an onset of exposure of a portion of the resistor to oxygen particles.

FIG. 2 illustrates FIG. 1 at an onset of exposure of a portion 15 of the resistor 14 to oxygen particles 20. The oxygen particles 20 may comprise oxygen-comprising molecules (e.g., molecular oxygen $O_2$, carbon dioxide $CO_2$, etc.) or oxygen ions, depending on which of several embodiments of the present invention is operative, as will be discussed infra. The oxygen-exposed portion 15 has an oxygen-exposed surface 17 (i.e.; the surface 17 is exposed to the oxygen particles 20). The resistor 14 includes an oxygen-unexposed portion 16 that has an oxygen-unexposed surface 18 (i.e.; the surface 18 is unexposed to the oxygen particles 20). The surface 19 (see FIG. 1) comprises the surfaces 17 and 18 which have surface areas $S_E$ and $S_U$, respectively. Thus the surface area S of the surface 19 (see FIG. 1) is $S_E+S_U$. In FIG. 2, the oxygen-unexposed portion 16 and the associated surface 18, if present, gives rise to a "partially exposed" embodiment, since the surface 19 will be partially exposed to the oxygen particles 20 (at the surface 17) such that $S_U>0$. The oxygen-unexposed portion 16 and the associated surface 18, if not present, gives rise to a "totally exposed" embodiment, since the surface 19 will be totally exposed to the oxygen particles 20 (at the surface 17) such that $S_U=0$.

Figure 3:
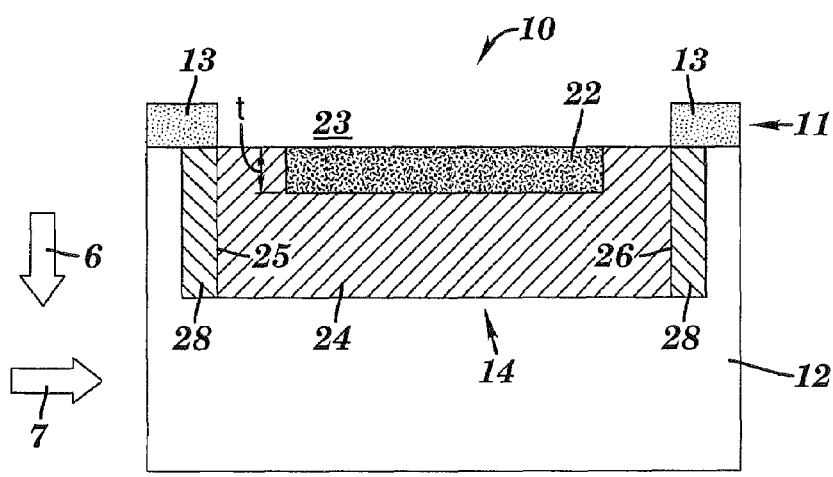
FIG. 3 depicts FIG. 2 after exposure of the portion of the resistor to the oxygen particles.

FIG. 3 illustrates FIG. 2 after the exposure of the portion 15 of the resistor 14 to the oxygen particles 20. The exposure of the portion 15 of the resistor 14 for a finite time of exposure generates an oxidized region 22 within the portion 15, wherein an unoxidized portion 24 of the resistor 14 remains. The oxidized region 22 is a fraction F of a surface layer of the resistor 14, wherein the surface layer is a region defined as the oxidized region 22 projected to the side surfaces 25 and 26 of the resistor 14. The fraction F is in a range of $0<F\leq 1$, wherein $0<F<1$ corresponds to the "partially exposed" embodiment, and F=1 corresponds to the "totally exposed" embodiment, discussed supra. The oxidized region 22 has a thickness t that may increase as the time of exposure increases or may reach a self-limiting thickness. For oxidation processes which are diffusion dominated, the thickness t may vary, inter alia, as a square root of the time of exposure. The oxidized region 22 increases an electrical resistance of the resistor 14 associated with current flow either in a direction 6 or in a direction 7, in comparison with an electrical resistance of the resistor 14 that existed before the oxidized region 22 was formed.

The resistor 14 could be within an integrated circuit and, accordingly, FIG. 3 also shows in of the integrated circuit above the resistor 14. The insulative layer 11 includes an insulative material 13 and an opening 23, wherein the opening 23 which defines the resistor 14 that is potentially oxidizable in accordance with the present invention. Note that there may be resistive regions 28 underneath the insulative material 13 and thus blocked by the insulative material 13. Accordingly, the underneath or blocked resistive regions 28 are not oxidizable in accordance with the present invention. Although not explicated or discussed in the embodiments described infra, the resistor 14 could be thought of as being "partially exposed" if the total resistor is defined as the resistor 14 in combination with the underneath or blocked resistive regions 28.

Figure 7:
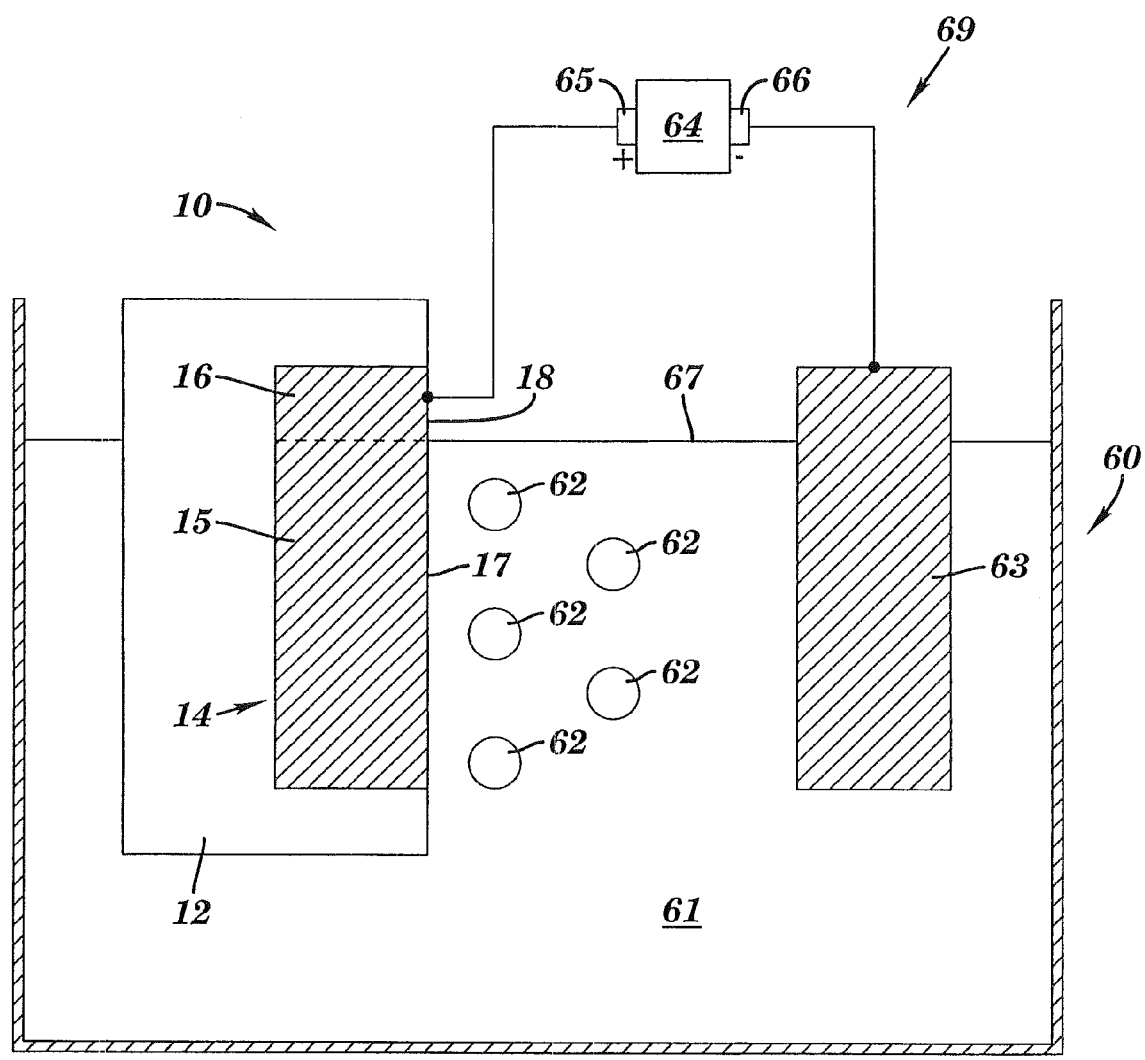
FIG. 7 depicts a front cross-sectional view of an anodization bath in which the semiconductor structure of FIG. 2 is partially immersed, in accordance with embodiments of the present invention.
Figure 8:
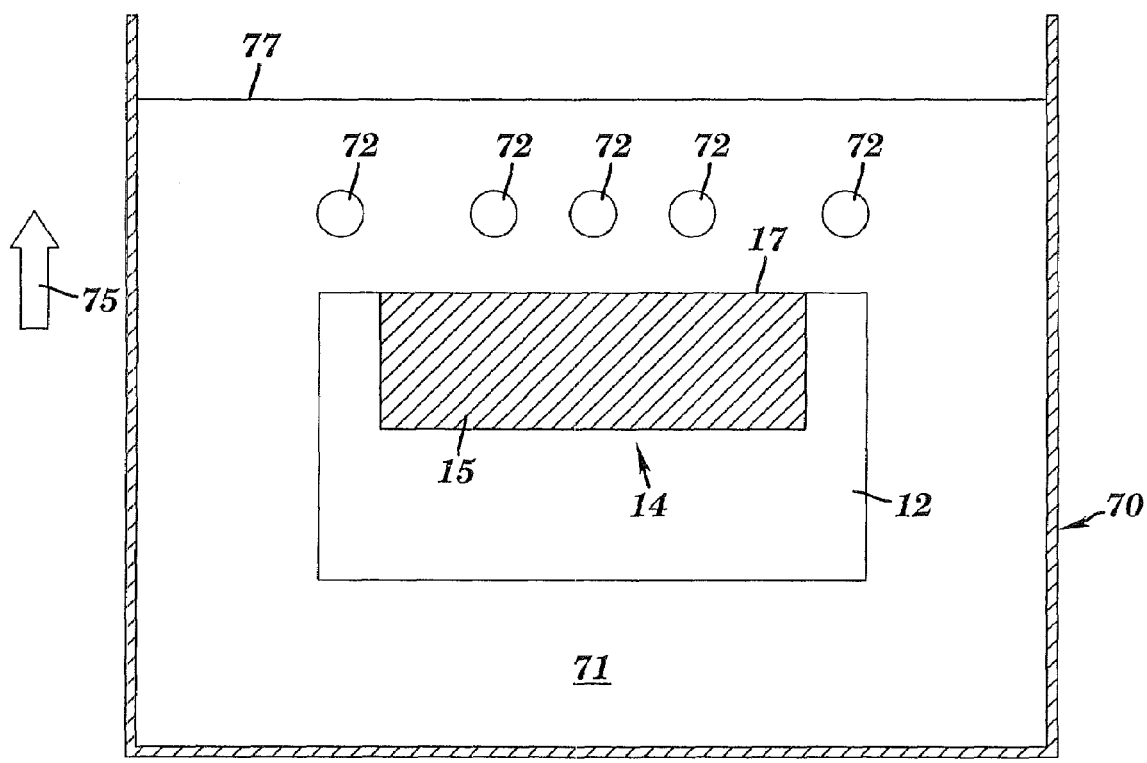
FIG. 8 depicts a front cross-sectional view of a chemical bath in which the resistor of the semiconductor structure of FIG. 2 is immersed, in accordance with embodiments of the present invention.
Figure 9:
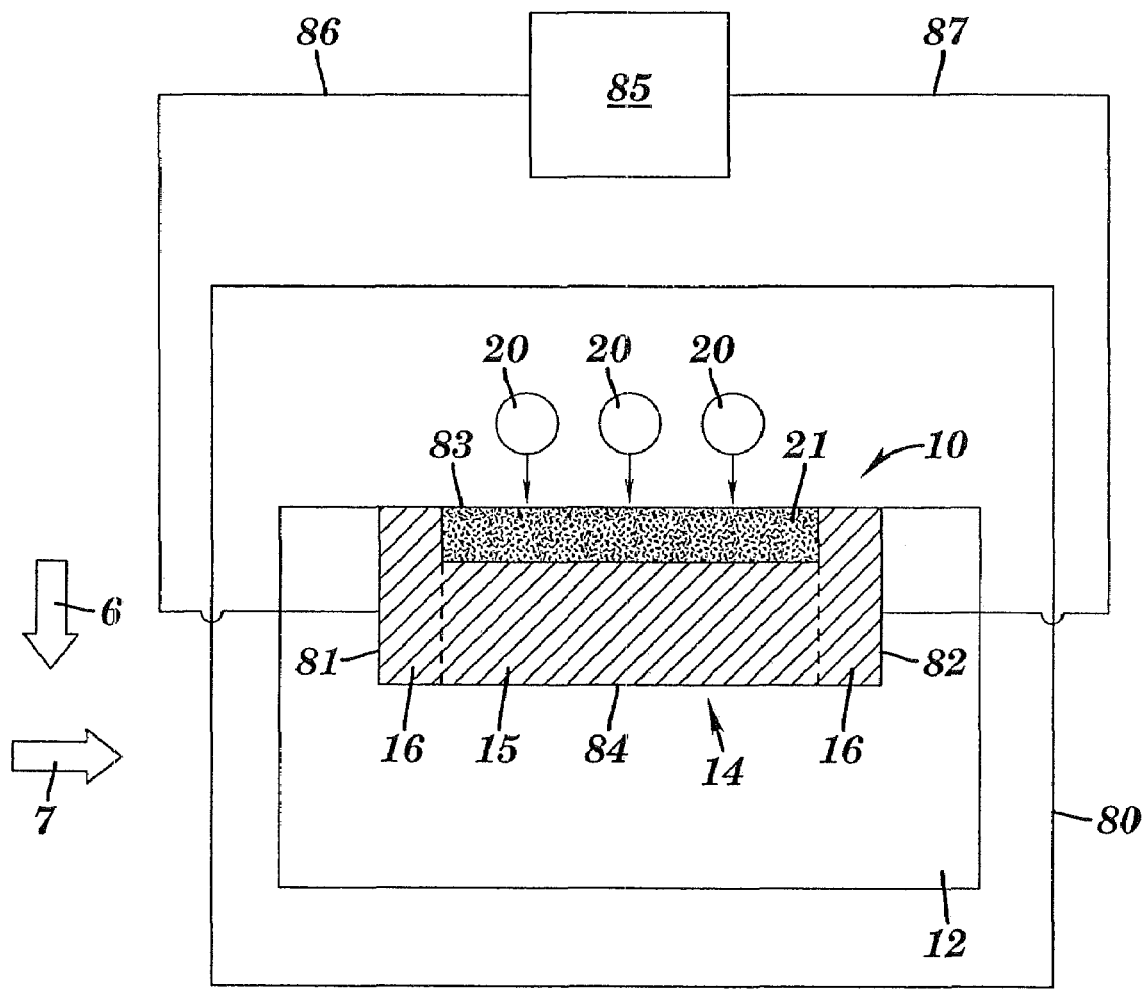
FIG. 9 depicts FIG. 2 during exposure of the portion of the resistor to the oxygen particles, and with the resistor coupled to an electrical resistance measuring apparatus, in accordance with embodiments of the present invention.

The present invention includes five embodiments for oxidizing the resistor 14 to increase the electrical resistance of the resistor 14, namely: thermal oxidation using a heating chamber (FIG. 4); thermal oxidation using a direct beam of radiation or particles (FIG. 5); plasma oxidation (FIG. 6); anodization (FIG. 7); and chemical oxidation (FIG. 8). The following discussion will describe these embodiments and explain how in situ testing can be used to control the electrical resistance acquired by the resistor 14 after being exposed to the oxygen particles 20 (FIG. 9).

While the five embodiments mentioned supra and discussed infra specifically describe oxidizing the resistor 14, the five embodiments mentioned supra and discussed infra are each applicable to changing an the resistance of the resistor 14 by nitridizing as an alternative to oxidizing. Nitridizing the resistor 14, as opposed to oxidizing the resistor 14, means reacting the resistor 14 with nitrogen particles (instead of with the oxygen particles 20) in a manner that forms a nitride of the electrically resistive material of the resistor 14 comprises (instead of forming an oxide of electrically resistive material that the resistor 14). As with the oxygen particles 20, the nitrogen particles may be in molecular or ionic form depending on the operative embodiment. "Partially exposed" and "fully exposed" embodiments are applicable to nitridization of the resistor 14, just as "partially exposed" and "fully exposed" embodiments are applicable to oxidation of the resistor 14. Unless noted otherwise herein, all features and aspects of the five embodiments, as discussed infra, apply to nitridization of the resistor 14 just as said all features and aspects of the five embodiments apply to oxidation.

Thermal Oxidation Using a Heating Chamber

Figure 4:
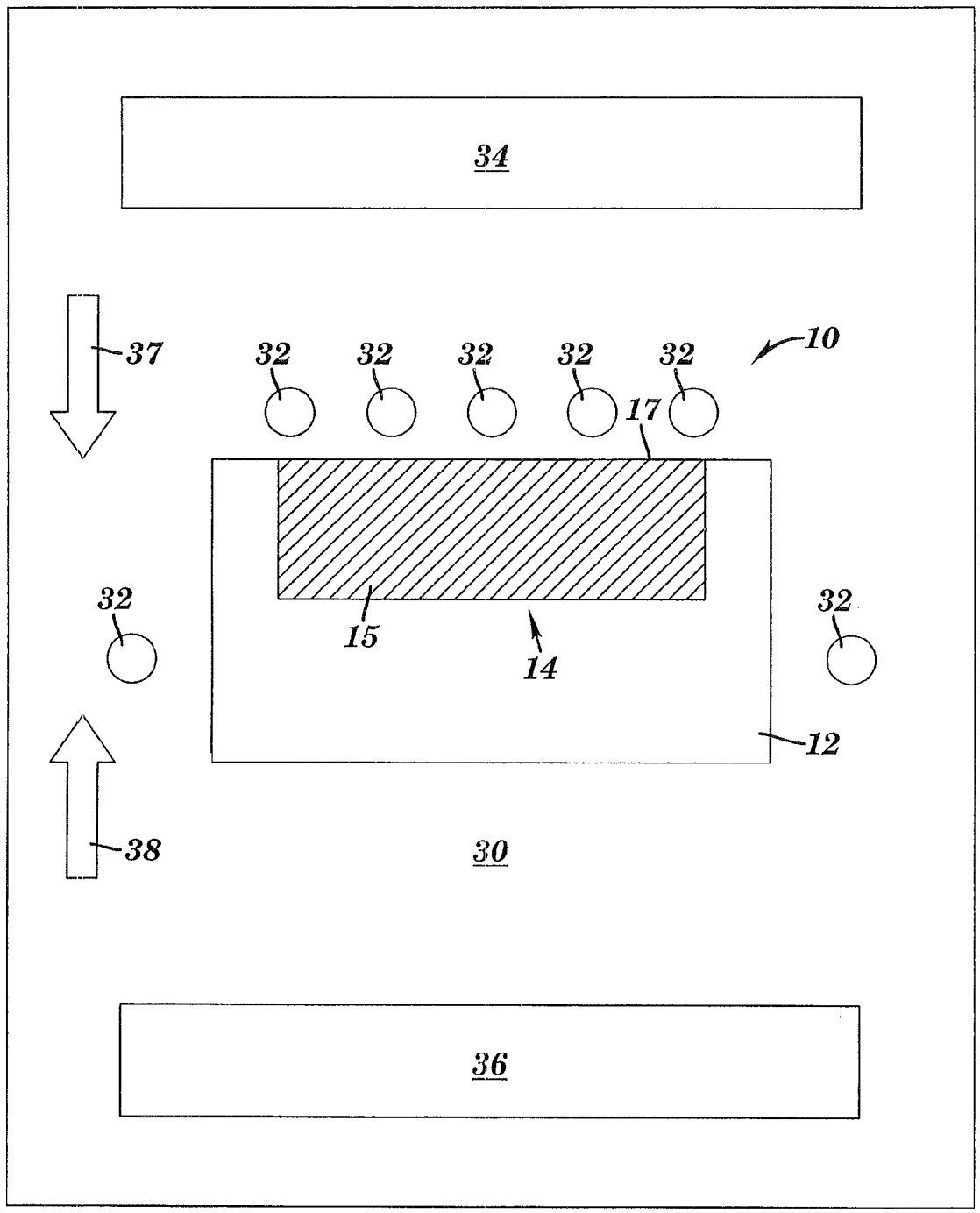
FIG. 4 depicts a front cross-sectional view of a heating chamber that includes the semiconductor structure of FIG. 2 and an oxygen-comprising gas, wherein the heating chamber generates heat that heats the semiconductor structure, in accordance with embodiments of the present invention.

FIG. 4 illustrates a front cross-sectional view of a heating chamber 30 that includes an oxygen-comprising gas 32 and the semiconductor structure 10 of FIG. 2, in accordance with embodiments of the present invention. The gas 32 includes an oxygen compound such as, inter alia, molecular oxygen ($O_2$), nitrous oxide ($N_2O$), carbon dioxide ($CO_2$), and carbon monoxide (CO).

The heating chamber 30 is heated to a heating temperature and the resistor 14 is thus oxidized by the gas 32 to form an oxide region within the resistor 14 such as the oxide region 22 depicted supra in FIG. 3. A thickness of the oxidized region (see, e.g., the thickness t of the oxidized region 22 described supra for FIG. 3) increases as a time of exposure of the resistor 14 to the gas 32 increases. FIG. 4 exemplifies a "totally exposed" embodiment in which the oxygen-unexposed portion 16 (see FIG. 2) of the resistor 14 does not exist (i.e., $S_U=0$ and F=1), and the surface 17 is the total surface 19 (see FIG. 1) that is oxidized. In FIG. 4, the oxygen concentration in the ambient gas 32 and the heating temperature, in combination, should be sufficient to oxidize the resistor 14. Said combinations depend on the chemistry of the oxidizing reaction between the resistor 14 and the gas 32. Thus, the required oxygen concentration and heating temperature depends on a material composition of the resistor 14 and the gas 32.

The gas 32 may be non-flowing in the form of a volumetric distribution within the heating chamber 30. Alternatively, the gas 32 may be in a flowing form at low flow, wherein the gas 32 contacts the resistor 14. Since the flowing gas 32 originates from a source that is likely to be substantially cooler than the heating temperature, the oxygen flow rate should be sufficiently slow as to minimize or substantially eliminate heat transfer from the resistor 14 to the gas 32. Such inhibition of heat transfer may by any method known to one of ordinary skill in the art. One such method is for the oxygen flow to be slow enough that the dominant mode of said heat transfer is by natural convection rather than by forced convection. An additional alternative using flowing oxygen includes preheating the gas 32 to a temperature sufficiently close to the heating temperature so that said heat transfer is negligible even if said heat transfer occurs by forced convection.

The heating chamber 30 in FIG. 4 includes any volumetric enclosure capable of heating the semiconductor structure 10 placed therein. The heat within the heating chamber 30 may be directed toward the semiconductor structure 10 in the direction 37 from a heat source 34 above the semiconductor structure 10. The heat within the heating chamber 30 may also be directed toward the semiconductor structure 10 in the direction 38 from a heat source 36 below the semiconductor structure 10. Heat directed from the heat source 34 in the direction 37 is transferred to the surface 17 more directly than is heat directed from the heat source 36 in the direction 38. Accordingly, the heat directed from the heat source 34 in the direction 37 is more efficient for raising the temperature at the surface 17 than is the heat directed from the heat source 36 in the direction 38. Either or both of the heat sources 34 and 36 may be utilized in the heating chamber 30. Either or both of the heat sources 34 and 36 may be a continuous heat source or a distributed array of discrete heat sources such as a distributed array of incandescent bulbs. Alternatively, the heating chamber 30 may be a furnace.

Any method of achieving the aforementioned heating temperature in the heating chamber 30 is within the scope of the present invention. For example, the semiconductor structure 10 could be inserted into the heating chamber 30 when the heating chamber 30 is at ambient room temperature, followed by a rapid ramping up of temperature within the heating chamber 30 until the desired heating temperature is achieved therein. If the heating temperature is spatially uniform at and near the resistor 14, then the oxidation of the resistor 14 in the direction 37 will be spatially uniform such that a thickness of the resultant oxide layer is about constant (see, e.g., the thickness t of the oxide layer 22 in FIG. 3 which is about constant). A spatially nonuniform heating temperature which would result in a oxide layer thickness that is not constant. Both uniform and nonuniform heating temperature distributions, and consequent uniform and nonuniform oxide layer thicknesses, are within the scope of the present invention.

Suitable resistor 14 electrically resistive materials for being oxidized in the heating chamber 30 include, inter alia, one or more of polysilicon, amorphous silicon, titanium, tantalum, tungsten, aluminum, silver, copper, or nitrides, suicides, or alloys thereof.

The aforementioned method of oxidizing the resistor 14 using the heating chamber 30 does not depend on the dimensions of the resistor 14 and is thus applicable if the resistor 14 has dimensions of 1 micron or less, and is likewise applicable if the resistor 14 has dimensions in excess of 1 micron.

As stated supra, thermal nitridization using a heating chamber could be used as an alternative to thermal oxidation using a heating chamber. If nitridization is employed, the gas 32 would include, instead of an oxygen compound, a nitrogen compound such as, inter alia, molecular nitrogen ($N_2$).

Thermal Oxidation Using a Directed Beam of Radiation or Particles

Figure 5:
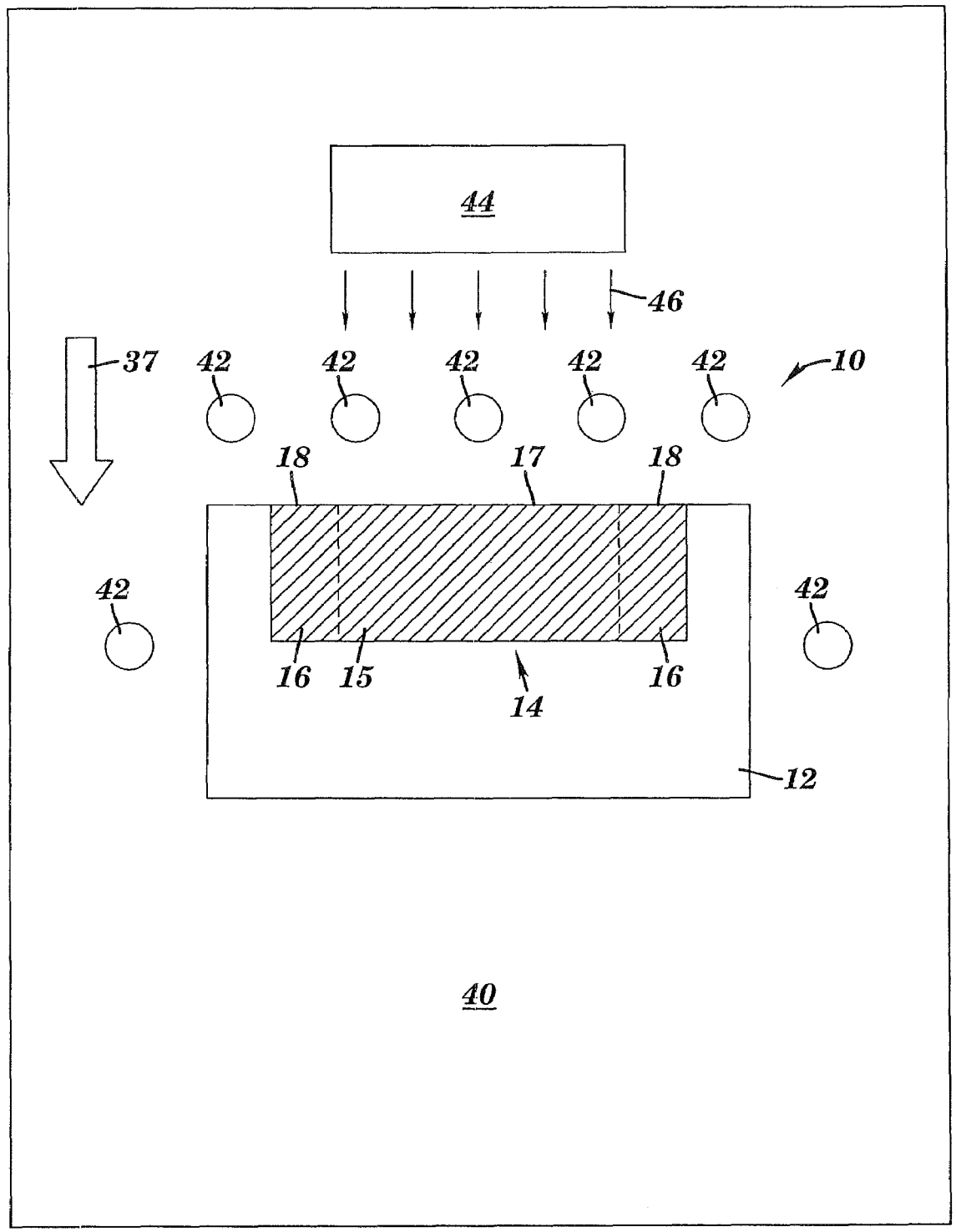
FIG. 5 depicts a front cross-sectional view of a chamber that includes the semiconductor structure of FIG. 2 and an oxygen-comprising gas, wherein the resistor of the semiconductor structure is heated by a directed beam of radiation or particles, in accordance with embodiments of the present invention.

FIG. 5 illustrates a front cross-sectional view of a chamber 40 that includes the semiconductor structure 10 of FIG. 2 and an oxygen-comprising gas 42, wherein the resistor 14 of the semiconductor structure 10 is heated by a directed beam 46 of radiation or particles, in accordance with embodiments of the present invention. The gas 42 includes an oxygen compound such as, inter alia, molecular oxygen ($O_2$), nitrous oxide ($N_2O$), carbon dioxide ($CO_2$), and carbon monoxide (CO). The gas 42 may be non-flowing or flowing as discussed supra in conjunction with the gas 32 of FIG. 4

The portion 15 of the resistor 14 is heated to a heating temperature by the directed beam 46, and the portion 15 is thus oxidized by the gas 32 to form an oxide region within the resistor 14 such as the oxide region 22 depicted supra in FIG. 3. A thickness of the oxidized region (see, e.g., the thickness t of the oxidized region 22 described supra for FIG. 3) increases as a time of exposure of the resistor 14 to the directed beam 46 increases. The thickness of the oxidized region also increases as an energy flux of the directed beam 46 increases. The directed beam 46 may include radiation (e.g., laser radiation), or alternatively, a beam of particles (e.g., electrons, protons, ions, etc.). The directed beam 46 must be sufficiently energetic to provide the required heating of the resistor 14, and a minimum required energy flux of the directed beam 46 depends on a material composition of the resistor 14. Additionally, the directed beam 46 should be sufficiently focused so that the aforementioned energy flux requirement is satisfied.

If the directed beam 46 includes laser radiation, then the laser radiation may comprise a continuous laser radiation or a pulsed laser radiation. If the resistor 14 comprises a metal, then the present invention will be effective for a wide range of wavelengths of the laser radiation, since a metal is characterized by a continuum of energy levels of the conduction electrons rather than discrete energy levels for absorbing the laser radiation.

The directed beam 46, which is generated by a source 44, may be directed to the oxygen-exposed portion 15 of the resistor 14 in a manner that the oxygen-unexposed portion 16 of the resistor 14 exists. For example, the source 44 may include a laser whose spot size area is less than the surface area S of the total surface 19 (see FIG. 1) of the resistor 14, and the associated directed beam 46 includes radiation from the laser of the source 44. Thus it is possible for the laser beam to traverse less than the total surface 19. Similarly, the source 44 may generate the directed beam 46 as the beam of particles, which impart energy to the resistor 14 and thus heat the resistor 14. The directed beam 46 may be localized to the surface 17 which requires that the directed beam 46 be sufficiently anisotropic; i.e., sufficiently localized to the direction 37 by the source 44, which depends on physical and operational characteristics of the source 44. Accordingly, if the directed beam 46 is localized to the surface 17, then FIG. 5 would exemplify a "partially exposed" embodiment in which the oxygen-unexposed portion 16 (see FIG. 2) exists (i.e., $S_U>0$ and F<1). Alternatively, FIG. 5 may also exemplify a "totally exposed" embodiment in which the oxygen-unexposed portion 16 (see FIG. 2) does not exist (i.e., $S_U=0$ and F=1), since the directed beam 46 could be directed to the total surface 19. Thus, FIG. 4 exemplifies either a "totally exposed" (F=1) or a "partially exposed" (F<1) embodiment in which the oxygen-unexposed portion 16 (see FIG. 2) may or may not exist. A spatial extent of partial or total exposure to, and associated reaction with, the oxygen-comprising gas 42 may be controlled by adjusting the size (i.e., area) of the directed beam 46 and/or by scanning the directed beam 46 across portions of the total surface 19 (see FIG. 1).

In FIG. 5, the oxygen concentration in the gas 32 and the heating temperature, in combination, should be sufficient to oxidize the resistor 14, and depends on the chemistry of the oxidizing reaction between the resistor 14 and the gas 32 as discussed supra in conjunction with FIG. 4. An ability to achieve the required temperature depends on the directed beam 46 being sufficiently energetic so as to impart enough energy to the portion 15 of the resistor 14 to facilitate the heating and consequent oxidation of the portion 15. The energy of the directed beam 46 is controlled at its source 44.

As stated supra, an advantage of using the directed beam 46 of FIG. 5 instead of the heating chamber 30 of FIG. 4 to heat the resistor 14 is the ability to heat less than the total exposed surface area 19 of the resistor 14. Another advantage is that said heating of the semiconductor structure 10 by the heating chamber 30 could potentially damage thermally-sensitive portions of the semiconductor structure 10 which cannot tolerate the temperature elevation caused by the heating chamber 30. In contrast, the localized heating by the directed beam 46 advantageously does not expose said thermally-sensitive portions of the semiconductor structure 10 to potential thermally-induced damage.

Suitable resistor 14 electrically resistive materials for being oxidized while being heated by the directed beam 46 include, inter alia, one or more of polysilicon, amorphous silicon, titanium, tantalum, tungsten, aluminum, silver, copper, or nitrides, silicides, or alloys thereof.

If the directed beam 46 is required to be confined to the surface 19 (see FIG. 1) of the resistor 14 (i.e., if the directed beam 46 should not strike any surface of the resistor 14 other than the surface 19), then dimensions of the surface 19 should be no smaller than a smallest surface area on which the directed beam 46 could be focused. For example, if the directed beam 46 includes laser radiation and the source 44 includes a laser, then the dimensions of the portion 15 of the resistor 14 may be no smaller than a laser spot dimension. Since with current and future projected technology, laser spot dimensions of the order of 1 micron or less are possible, the portion 15 of the resistor 14 may have dimensions of 1 micron or less (to an extent possible with prevailing laser technology at a time when the present invention is practiced), as well as dimensions exceeding 1 micron, when the directed beam 46 includes the laser radiation.

As stated supra, thermal nitridization using a directed beam of radiation or particles could be used as an alternative to thermal oxidation using a directed beam of radiation or particles. If nitridization is employed, the gas 42 would include, instead of an oxygen compound, a nitrogen compound such as, inter alia, molecular nitrogen ($N_2$).

Plasma Oxidation

Figure 6:
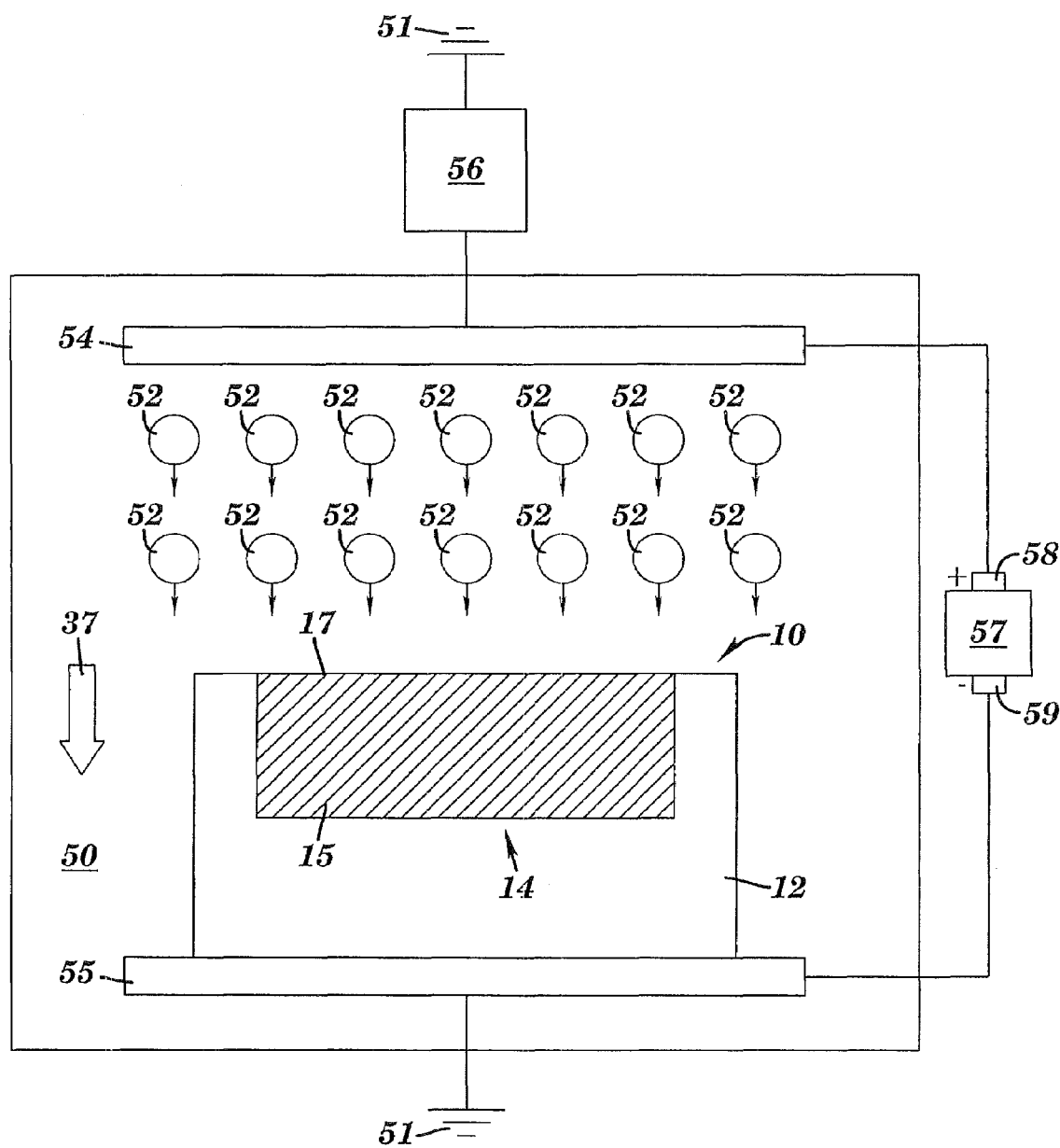
FIG. 6 depicts a front cross-sectional view of a plasma chamber that includes the semiconductor structure of FIG. 2, in accordance with embodiments of the present invention.

FIG. 6 illustrates a front cross-sectional view of a plasma chamber 50 that comprises the semiconductor structure 10 of FIG. 2, in accordance with embodiments of the present invention. The plasma chamber 50 includes an electrode 54 and an electrode 55. The semiconductor structure 10 has been disposed between the electrode 54 and the electrode 55. The plasma chamber 50 also includes oxygen ions 52 which are formed in generation of a plasma gas, as will be explained infra.

A neutral gas within the plasma chamber 50 includes an oxygen compound such as, inter alia, molecular oxygen ($O_2$), nitrous oxide ($N_2O$), carbon dioxide ($CO_2$), and carbon monoxide (CO). Inasmuch as a plasma gas will be formed from the neutral gas, the plasma chamber 50 may also include one or more noble gases (e.g., argon, helium, nitrogen, etc.) to perform such functions as: acting as a carrier gas, providing electric charge needed for forming ionic species of the plasma, assisting in confining the plasma to within fixed boundaries, assisting in developing a target plasma density or a target plasma density range, and promoting excited state plasma lifetimes.

A power supply 56 generates an electrical potential between the electrode 54 and the electrode 55. The power supply 56 may be of any type known to one skilled in the art such as, inter alia: a radio frequency (RF) power supply; a constant voltage pulsed power supply (see, e.g., U.S. Pat. No. 5,917,286, June 1999, Scholl et al.); and a direct current (DC) voltage source (see, e.g., U.S. Pat. No. 4,292,384, September 1981, Straughan et al.). Pertinent characteristics of the power supply 56 are in accordance with such characteristics as are known in the art. For example, a RF power supply may include, inter alia, a radio frequency selected from a wide range of frequencies such as a commonly used frequency of 13.56 Hz. The power requirements of the RF power supply depends on the surface area 17 of the resistor 14 and is thus case dependent. For example, a typical range of power of the RF power supply may be, inter alia, between about 100 watts and about 2000 watts.

The electrical potential generated by the power supply 56 ionizes the neutral gas to form a plasma between the electrode 54 and the electrode 55, wherein the plasma comprises electrons and ions, and wherein a plasma ion polarity depends on the particular neutral gas within the plasma chamber 50. For example, if the neutral gas includes molecular oxygen, then a three-component plasma may be formed including electrons, positive oxygen ions, and negative oxygen ions, such that in the glow discharge a predominant positive ion is $O2+$ and a lesser positive ionic species is $O^+$. See U.S. Pat. No. 5,005, 101 (Gallagher et al.; April 1991; col. 6, lines 1-12).

In FIG. 6, a DC power supply 57 has terminals 58 and 59, wherein the terminal 58 is positive with respect to a ground 51, and the terminal 59 is negative with respect to the terminal 58. The DC power supply 57 generates an electric field that is directed from the electrode 54 to the electrode 55, and the electric field is capable of accelerating positive ions from the electrode 54 toward the electrode 55 in the direction 37. Accordingly, if the oxygen ions 52 are positive oxygen ions (e.g., $O_2^+$), then the electric field accelerates the oxygen ions 52 of the plasma toward the electrode 55 causing the oxygen ions 52 to strike the portion 15 of the resistor. If the oxygen ions 52 are sufficiently energetic (i.e., if the oxygen ions 52 have a minimum or threshold energy) as required to oxidize the portion 15 of the resistor 14, then the oxygen ions 52 will so oxidize the portion 15 and thus form an oxidized region within the resistor 14, such as the oxidized region 22 depicted supra in FIG. 3. A thickness of the oxidized region (see, e.g., the thickness t of the oxidized region 22 described supra for FIG. 3) increases as a time of exposure of the resistor 14 to the accelerated oxygen ionic species 52 increases.

If the oxygen ions 52 are negative oxygen ions to be accelerated toward the resistor 14 and reacted with the resistor 14, then the polarities of the terminals 58 and 59 should be reversed (i.e., the terminals 58 and 59 should have negative and positive polarities, respectively). A factor in determining whether positive or negative oxygen ions 52 are to be reacted with the resistor 14 includes consideration of the chemical reactions between said accelerated oxygen ions 52 and the electrically resistive material of the resistor 14, since characteristics of said chemical reactions (e.g., reaction energetics, reaction rate, etc.) may be a function of the polarity of the reacting ionic oxygen species 52. Nonetheless, if negative oxygen ions 52 of the plasma are accelerated by the DC power supply 57 toward the resistor 14, then electrons of the plasma will also be accelerated toward the resistor 14, which in some situations may result in undesirable interactions between said electrons and the resistor 14. Thus, each of the aforementioned considerations (e.g., material of the resistor 14, characteristics of the chemical reactions between the oxygen ions 52 and the resistor 14, etc.) must be considered when choosing the neutral gas and choosing which ionic species 52 to react with the resistor 14.

The accelerated oxygen ions 52 transfer energy to the resistor 14 to provide at least the threshold energy required for effectuating the chemical reaction between the oxygen ions 52 and the resistor 14, and such energy transferred substitutes for thermal energy (i.e., heat) provided by the heating chamber 30 of FIG. 4, or by the directed beam 46 of radiation or particles of FIG. 5, to the resistor 14. A voltage output of the DC power supply 57 must be sufficient to accelerate the oxygen ions 52 to at least the aforementioned threshold energy.

FIG. 6 exemplifies a "totally exposed" embodiment in which the oxygen-unexposed portion 16 (see FIG. 2) of the resistor 14 does not exist (i.e., $S_U=0$ and $F=1$), and the surface 17 is the total surface 19 (see FIG. 1) that is oxidized in the plasma chamber 50.

While FIG. 6 depicts a particular plasma chamber 50 configuration for oxidizing the resistor 14, any plasma configuration known to one of ordinary skill in the art may be used.

Suitable resistor 14 electrically resistive materials for being subject to plasma oxidation include, inter alia, one or more of polysilicon, amorphous silicon, titanium, tantalum, tungsten, aluminum, silver, copper, or nitrides, silicides, or alloys thereof.

The aforementioned method of oxidizing the resistor 14 using plasma oxidation does not depend on the dimensions of the resistor 14 and is thus applicable if the resistor 14 has dimensions of 1 micron or less, and is likewise applicable if the resistor 14 has dimensions in excess of 1 micron.

As stated supra, plasma nitridization using a directed beam of radiation or particles could be used as an alternative to plasma oxidation using a directed beam of radiation or particles. If nitridization is employed, the neutral gas within the plasma chamber 50 would include, instead of an oxygen compound, a nitrogen compound such as, inter alia, molecular nitrogen ($N_2$).

Anodization

FIG. 7 illustrates a front cross-sectional view of an anodization bath 60, in accordance with embodiments of the present invention. Generally, anodizing a first conductive material such as a semiconductor or metal requires immersing into an electrolytic solution both the first conductive material and a second conductive material, and passing a DC current at a sufficient voltage through the electrolytic solution.

An anodization electrical circuit 69 includes a DC power supply 64, an electrolytic solution 61 which includes oxygen, the semiconductor structure 10 of FIG. 2 wherein the resistor 14 is partially immersed in the electrolytic solution 61, and an electrode 63 partially immersed in the electrolytic solution 61. "Partially immersed" includes "totally immersed" (i.e., 100% immersed) as a special case. The resistor 14 is made of the electrically resistive material which includes the first conductive material that serves as an anode, and the electrode 63 is made of the second conductive material that serves as a cathode. The second conductive material of the cathode may include any inert metal (e.g., platinum) that does not react with the electrolytic solution 61. The resistor 14 is made anodic by electrically coupling the resistor 14 to a positive terminal 65 of the DC power supply 64. The electrode 63 is made cathodic by electrically coupling the electrode 63 to a negative terminal 66 of the DC power supply 64. The anodization may be performed at or above ambient room temperature. A thickness of an oxide film formed with the resistor 14 is a function of a voltage output from the DC power supply 64 and the current density in the anodization circuit 69. The specific voltage and current density is application dependent and would be selected from known art by one of ordinary skill in the art. For example, an anodization of tantalum or tantalum nitride at ambient room temperature and at with a current density of about 0.1 milliamp/cm$^2$ in an electrolytic solution of citric acid will generate an oxide (i.e., tantalum pentoxide $Ta_2O_5$) film thickness of 20 Å per volt. Thus for an applied voltage of about 25 volts, the $Ta_2O_5$) film thickness is about 500 Å.

Suitable resistor 14 electrically resistive materials for being anodized include, inter alia, . Suitable cathode 63 materials include, inter alia tantalum, titanium, polysilicon, aluminum, tungsten, nitrides thereof, and alloys thereof. A electrolyte containing oxygen that can be used depends on the electrically resistive material to be anodized and is therefore case specific. Thus, any electrolyte containing oxygen that is compatible with said electrically resistive material may be selected as would be known or apparent to one of ordinary skill in the art.

Upon activation of the DC power supply 64 (i.e., the DC power supply 64 is turned on), and under the voltage output (and the associated current) from the DC power supply 64, an electrolytic reaction occurs at the surface 17 of the resistor 14 to generate hydrogen ions, electrons, and oxygen ions 62 from the electrolytic solution. The oxygen ions 62 chemically react with the portion 15 of the resistor 14 such that an oxidized region, such as the oxidized region 22 depicted supra in FIG. 3, forms within the portion 15 of the resistor 14. The generated hydrogen ions and electrons combine at the cathode 63 to form hydrogen gas.

FIG. 7 shows the portion 16 of the resistor 14 above an electrolyte level 67. Accordingly, FIG. 7 may exemplify a "partially exposed" embodiment in which the oxygen-unexposed portion 16 (see FIG. 2) exists (i.e., $S_U>0$ and $F<1$). Alternatively, FIG. 7 may also exemplify a "totally exposed" embodiment in which the oxygen-unexposed portion 16 (see FIG. 2) does not exist (i.e., $S_U=0$ and $F=1$) if the resistor 14 is totally immersed in the electrolytic solution 61. Thus, FIG. 7 exemplifies either a "partially exposed" embodiment or a "totally exposed" embodiment in which the oxygen-unexposed portion 16 (see FIG. 2) exists or does not exist, respectively.

A thickness of the oxidized region (see, e.g., the thickness t of the oxidized region 22 described supra for FIG. 3) increases as a time of the electrolytic reaction increases. As the thickness of the oxidized region increases, a current drawn by the anodizing bath 60 decreases due to increasing isolation of the portion 15 of the resistor 14 from the electrolytic solution 61 as the thickness of the oxidized layer increases. For certain resistor 14 materials (e.g., aluminum), the anodization process may eventually self terminate, because said current is eventually reduced to a negligible value.

The aforementioned method of oxidizing the resistor 14 using anodization does not depend on the dimensions of the resistor 14 and is thus applicable if the portion 15 of the resistor 14 has dimensions of 1 micron or less, and is likewise applicable if the portion 15 of the resistor 14 has dimensions in excess of 1 micron.1

As stated supra, anodization that causes nitridization of the resistor 14 could be used as an alternative to anodization that causes oxidation of the resistor 14. If anodization with nitridization is employed instead of anodization with oxidation, then the electrolytic solution 61 would include nitrogen instead of oxygen. An electrolyte containing nitrogen that can be used depends on the electrically resistive material to be anodized and is therefore case specific. Thus, any electrolyte containing nitrogen that is compatible with said electrically resistive material may be selected as would be known or apparent to one of ordinary skill in the art.

Chemical Oxidation

FIG. 8 illustrates a front cross-sectional view of a chemical bath 70, in accordance with embodiments of the present invention. The chemical bath 70 comprises a chemical solution 71. The semiconductor structure 10 of FIG. 2 is immersed in the chemical solution 71. The chemical solution 71 includes oxygen particles 72 in such form as oxygen-comprising liquid molecules, oxygen ions, or an oxygen-comprising gas (e.g., oxygen gas or ozone gas) dissolved in the chemical solution 71 under pressurization. The oxygen particles 72 chemically react with the resistor 14 to form an oxidized region within the resistor 14 such as the oxidized region 22 depicted supra in FIG. 3. A thickness of the oxidized region (see, e.g., the thickness t of the oxidized region 22 described supra for FIG. 3) increases as a time of the chemical reaction increases. The chemical reaction may be exothermic or endothermic, depending on the electrically resistive material of the resistor 14 and the oxygen particles 72. If the chemical reaction is endothermic, an addition of a sufficient amount of heat is required. Additionally, a suitable catalyst may be utilized to accelerate the chemical reaction. The catalyst may be any catalyst known to one of ordinary skill in the art for the particular chemical reaction.

Suitable resistor 14 electrically resistive materials for being chemically oxidized include, inter alia, copper, tungsten, aluminum, titanium, nitrides thereof, and alloys thereof.

Suitable chemical solutions 71 include, inter alia, hydrogen peroxide, ferric nitrate, ammonium persulphate, etc.

FIG. 8 shows the resistor 14 as totally immersed in the chemical solution 71, which exemplifies a "totally exposed" embodiment in which the oxygen-unexposed portion 16 (see FIG. 2) of the resistor 14 does not exist (i.e., $S_U=0$ and F=1), and the surface 17 is the total surface 19 (see FIG. 1) that is oxidized in the chemical solution 71. Nonetheless, the resistor 14 could be rotated 90 degrees (within the cross-section plane illustrated in FIG. 8) and moved upward in a direction 75 such that a portion of the resistor 14 would be above the level 77 of the chemical solution 71 just as the portion 16 is above the electrolyte level 67 in FIG. 7. Under such 90 degree rotation and upward movement, FIG. 8 would represent a "partially exposed" embodiment in which the oxygen-unexposed portion 16 (See FIG. 2) exists (i.e., $S_U>0$ and F<1). Accordingly, FIG. 8 exemplifies either a "partially exposed" embodiment or a "totally exposed" embodiment in which the oxygen-unexposed portion 16 (see FIG. 2) exists or does not exist, respectively.

The aforementioned method of oxidizing the resistor 14 using chemical oxidation does not depend on the dimensions of the resistor 14 and is thus applicable if the resistor 14 has dimensions of 1 micron or less, and is likewise applicable if the resistor 14 has dimensions in excess of 1 micron.

As stated supra, chemical nitridization of the resistor 14 could be used as an alternative to chemical oxidation of the resistor 14. If chemical nitridization is employed instead of chemical oxidation, then the chemical solution 71 would include nitrogen particles instead of the oxygen particles 72.

Resistance Testing

The resistor 14 may be tested prior to being oxidized or nitridized, while being oxidized or nitridized (i.e., in situ), and/or after being oxidized or nitridized. The resistance testing may be accomplished by a conventional test apparatus, such as with a four-point resistance test having four contacts to the resistor with two of the contacts coupled to a known current source outputting a current I and the other two contacts coupled to a voltage meter that measures a voltage V across the resistance to be determined, and the measured resistance is thus V/I. Alternatively, the resistance testing may be accomplished with an inline measuring circuit within the same integrated circuit that includes the resistor, wherein the measuring circuit is coupled to instrumentation that outputs the measured resistance.

FIG. 9 illustrates FIG. 2 during exposure of the portion 15 of the resistor 14 to the oxygen particles 20, and with the resistor 14 coupled to an electrical resistance measuring apparatus 85. The electrical resistance measuring apparatus 85 may include the conventional test apparatus or the inline measuring circuit, mentioned supra. The electrical resistance measuring apparatus 85 may be conductively coupled to surfaces 81 and 82 of the resistor 14 by conductive interconnects (e.g., conductive wiring) 86 and 87, respectively. Accordingly, the electrical resistance measuring apparatus 85 is capable of measuring an electrical resistance of the resistor 14 (before, during, and after oxidation or nitridization of the resistor 14) associated with current flowing in the direction 7 through the resistor 14. Alternatively, the electrical resistance measuring apparatus 85 may be used to measure an electrical resistance of the resistor 14 associated with current flowing in the direction 6 through the resistor 14 (before, during, and after oxidation or nitridization of the resistor 14) if the conductive interconnects 86 and 87 are coupled to bounding surfaces 83 and 84 of the resistor 14 instead of to the surfaces 81 and 82, respectively. The surface 83 in FIG. 9 corresponds to the surface 19 in FIG. 1. In FIG. 9, the resistor 14 includes an oxidized (or nitridized) region 21, which corresponds to the oxidized (or nitridized) region 22 of FIG. 3. The semiconductor structure 10 is within an oxidizing (or nitridizing) environment 80, which includes any oxidizing (or nitridizing) environment within the scope of the present invention such, inter alia, the heating chamber 30 of FIG. 4, the chamber 40 of FIG. 5, the plasma chamber 50 of FIG. 6, the anodization bath 60 of FIG. 7, and the chemical bath 70 of FIG. 8. The electrical resistance measuring apparatus 85 is any apparatus, as is known to one of ordinary skill in the art, capable of measuring an electrical resistance of the resistor 14.

The following discussion describes how the electrical resistance measuring apparatus 85 of FIG. 9 can be used for in situ testing to control the electrical resistance acquired by the resistor 14 after being exposed to the oxygen particles 20. The following discussion applies to any of the embodiments described supra ( i.e., thermal oxidation or nitridization using a heating chamber, thermal oxidation or nitridization using a directed beam of radiation or particles, plasma oxidation/nitridization, anodization, and chemical oxidation/nitridization).

Let $R_1$ denote an electrical resistance of the resistor 14 prior to being oxidized or nitridized. Let $R_2$ denote a final electrical resistance of the resistor 14 (i.e., an electrical resistance of the resistor 14 after being oxidized or nitridized). Let $R_t$ denote a predetermined target electrical resistance with an associated resistance tolerance $\Delta R_t$ for the resistor 14 after the oxidation (or nitridization) has been completed (i.e., it is intended that $R_2=R_t$ within the tolerance $\Delta R_t$). The target electrical resistance $R_t$ is application dependent. For example, in an analog circuit $R_t$ may be a function of a capacitance in the circuit, wherein for the given capacitance, $R_t$ has a value that constrains the width of a resonance peak to a predetermined upper limit. In practice, the predetermined resistance $R_t$, together with the associated resistance tolerance $\Delta R_t$, may be provided for the intended application.

The resistor 14 may have its electrical resistance tested during or after the exposure of the resistor 14 to the oxygen particles 20. As stated supra, the thickness t of the oxidized (or nitridized) region 22 (see FIG. 3) increases as the time of said exposure increases, and the electrical resistance of the resistor 14 increases as the thickness t increases. Thus, the final electrical resistance may be controlled by selection of the time of exposure. The time of exposure may be selected based on any method or criteria designed to obtain $R_2$ as being within $R_t \pm \Delta R_t$ (i.e., $R_t - \Delta R_t \leq R_2 \leq R_t + \Delta R_t$). For example, calibration curves derived from prior experience may be used for determining the time of exposure that results in $R_2$ being within $R_t \pm \Delta R_t$.

An iterative testing procedure may be utilized such that the electrical resistance of the resistor 14 is tested during the exposing of the resistor 14 to the oxygen particles 20 and thus during the oxidizing (or nitridizing) of the resistor 14. The testing during the exposing of the resistor 14 to the oxygen particles 20 determines continuously or periodically whether $R_2"$ is within $R_t \pm \Delta R_t$, wherein $R_2"$ is the latest resistance of the resistor 14 as determined by the testing. The testing is terminated if $R_2"$ is within $R_t \pm \Delta R_t$ or if $(R_2"-R_1)(R_t-R_2") \leq 0$.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for increasing an electrical resistance of a resistor, comprising the steps of:
- predetermining a target resistance $R_t$ and an associated tolerance $\Delta R_t$ for the electrical resistance of the resistor;
- providing a semiconductor structure that includes the resistor;
- exposing a fraction F of an exterior surface of a surface layer of the resistor to nitrogen particles, wherein F<1, wherein said exposing comprises immersing the semiconductor structure in a chemical solution such that the fraction F of the exterior surface of the surface layer of the resistor is immersed in the chemical solution, and wherein the chemical solution includes the nitrogen particles in a nitrogen comprising gas dissolved in the chemical solution under pressurization;
- nitridizing the fraction F of the exterior surface of the surface layer by chemically reacting the fraction F of the exterior surface with said nitrogen particles during said exposing in a chemical reaction that increases an electrical resistance of the resistor, wherein a thickness of a nitridized portion of the surface layer increases as a time of the chemical reaction increases; and
- testing the resistor during the nitridizing step to determine whether the electrical resistance of the resistor is within $R_t \pm \Delta R_t$.

2. The method of claim 1, wherein if during the testing step the electrical resistance of the resistor is determined to not be within $R_t \pm \Delta R_t$ then the method further comprises:
- iterating such that each iteration of the iterating includes additionally executing the exposing and nitridizing steps and additionally testing the resistor during the nitridizing step to determine whether $R_2"$ is within $R_t \pm \Delta R_t$, wherein $R_2"$ is a latest value of the electrical resistance of the resistor as determined by said testing; and
- ending the iterating if $R_2"$ is within $R_t \pm \Delta R_t$ or if $(R_2"-R_1)(R_t-R_2") < 0$, wherein $R_1$ is a latest value of the determined electrical resistance of the resistor immediately prior to said testing.

3. The method of claim 1, wherein F <1.

4. The method of claim 1, wherein F =1.

5. The method of claim 1, wherein said ending the iterating comprises satisfying $R_2"$ being within $R_t \Delta R_t$.

6. The method of claim 5, wherein the method further comprises determining from a calibration curve the time of exposure that results in the electrical resistance of the resistor being within $R_t \pm \Delta R_t$ as a result of said nitridizing, and wherein said nitridizing is performed for the determined time of exposure.

7. The method of claim 1, wherein said ending the iterating comprises satisfying $(R_2"-R_1)(R_t-R_2") < 0$.

8. The method of claim 1, wherein said testing comprises continuously testing the resistor during the nitridizing step.

9. The method of claim 1, wherein said testing comprises periodically testing the resistor during the nitridizing step.

10. The method of claim 1, wherein the chemical reaction is exothermic.

11. The method of claim 1, wherein the chemical reaction is endothermic.

12. The method of claim 1, wherein the resistor has a dimension of 1 micron or less.

13. The method of claim 1, wherein the resistor includes copper.

14. The method of claim 1, wherein the resistor includes tungsten.

15. The method of claim 1, wherein the resistor includesaluminum.

16. The method of claim 1, wherein the resistor includes titanium.

17. The method of claim 1, wherein the resistor includes an alloy comprising copper.

18. The method of claim 1, wherein the resistor includes an alloy comprising tungsten.

19. The method of claim 1, wherein the resistor includes an alloy comprising aluminum.

20. The method of claim 1, wherein the resistor includes an alloy comprising titanium.

* * * * *